US009607714B2

United States Patent
Malladi et al.

(10) Patent No.: US 9,607,714 B2
(45) Date of Patent: *Mar. 28, 2017

(54) HARDWARE COMMAND TRAINING FOR MEMORY USING WRITE LEVELING MECHANISM

(71) Applicant: NVIDIA Corporation, Santa Clara, CA (US)

(72) Inventors: Venkata Ramana Malladi, San Jose, CA (US); Tony Yuhsiang Cheng, Union City, CA (US); Sharath Raghava, Campbell, CA (US); Ambuj Kumar, Sunnyvale, CA (US); Arunjit Sahni, San Jose, CA (US); Paul Lam, Kitchener (CA)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/728,953

(22) Filed: Dec. 27, 2012

(65) Prior Publication Data

US 2014/0181451 A1    Jun. 26, 2014

Related U.S. Application Data

(63) Continuation-in-part of application No. 13/726,926, filed on Dec. 26, 2012.

(51) Int. Cl.
| | |
|---|---|
| G06F 12/00 | (2006.01) |
| G11C 29/02 | (2006.01) |
| G11C 5/04 | (2006.01) |
| G11C 7/20 | (2006.01) |

(52) U.S. Cl.
CPC .......... *G11C 29/023* (2013.01); *G11C 29/028* (2013.01); *G11C 5/04* (2013.01); *G11C 7/20* (2013.01); *G11C 2207/2254* (2013.01)

(58) Field of Classification Search
CPC . G11C 5/04; G11C 29/023; G11C 2207/2254; G11C 7/20; G11C 29/028
USPC ........ 711/105, 100, 154, 166–167, E12.001; 365/76
See application file for complete search history.

(56) References Cited

U.S. PATENT DOCUMENTS

| | | |
|---|---|---|
| 5,692,165 A | 11/1997 | Jeddeloh et al. |
| 6,161,208 A | 12/2000 | Dutton et al. |
| 6,934,871 B2 | 8/2005 | Day et al. |

(Continued)

OTHER PUBLICATIONS

Mintarno et al., "Bit-Pattern Sensitivity Analysis and Optimal On-Die-Termination for High-Speed Memory Bus Design", IEEE 18th Conference on Electrical Performance of Electronic Packaging and Systems (EPEPS), Oct. 19-21, 2009, pp. 199-202.

*Primary Examiner* — Jasmine Song

(57) ABSTRACT

A method of training a command signal for a memory module. The method includes programming a memory controller into a mode where a single bit of an address signal is active for a single clock cycle. The method then programs a programmable delay line of the address signal with a delay value and performs initialization of the memory module. The memory module is then placed in a write leveling mode. A write leveling procedure is then performed and a response to the write leveling procedure is determined from the memory module. A determination is made whether the memory module is in a pass state or an error state based on the response.

20 Claims, 5 Drawing Sheets

(56) References Cited

U.S. PATENT DOCUMENTS

| | | |
|---|---|---|
| 7,057,950 B2 | 6/2006 | Lee |
| 7,155,579 B1 | 12/2006 | Neils et al. |
| 7,259,606 B2 | 8/2007 | Ku et al. |
| 7,480,193 B2 | 1/2009 | Ware |
| 7,647,467 B1 | 1/2010 | Hutsell et al. |
| 8,019,957 B1 | 9/2011 | White et al. |
| 8,060,785 B2 | 11/2011 | Lin et al. |
| 8,081,527 B1 | 12/2011 | Venkataraman et al. |
| 8,422,263 B2 * | 4/2013 | Saito et al. .................... 365/63 |
| 2003/0004667 A1 | 1/2003 | Zumkehr |
| 2003/0236641 A1 | 12/2003 | Liou |
| 2004/0136462 A1 | 7/2004 | Chen et al. |
| 2004/0225847 A1 | 11/2004 | Wastlick et al. |
| 2005/0166110 A1 | 7/2005 | Swanson et al. |
| 2006/0136681 A1 | 6/2006 | Jain et al. |
| 2010/0039875 A1 | 2/2010 | Stott et al. |
| 2010/0257397 A1 | 10/2010 | Schoenborn et al. |
| 2010/0309706 A1 | 12/2010 | Saito et al. |
| 2011/0040902 A1 | 2/2011 | Housty |
| 2011/0090749 A1 | 4/2011 | Bhakta et al. |
| 2011/0320867 A1 | 12/2011 | Chaudhuri et al. |
| 2012/0307577 A1 | 12/2012 | Sriadibhatla et al. |
| 2013/0103890 A1 | 4/2013 | Grunzke |
| 2013/0155788 A1 | 6/2013 | Brandl et al. |
| 2013/0315014 A1 | 11/2013 | Dearth et al. |
| 2014/0029364 A1 | 1/2014 | Bhakta et al. |

* cited by examiner

HARDWARE COMMAND TRAINING FOR MEMORY USING WRITE LEVELING MECHANISM

CROSS-REFERENCE TO RELATED APPLICATIONS

This application is related to patent applications: "HARDWARE CHIP SELECT TRAINING FOR MEMORY USING WRITE LEVELING MECHANISM," concurrently filed with this application, "HARDWARE CHIP SELECT TRAINING FOR MEMORY USING READ COMMANDS," concurrently filed with this application, "MULTI-DIMENSIONAL HARDWARE DATA TRAINING BETWEEN MEMORY CONTROLLER AND MEMORY," concurrently filed with this application, "METHOD AND SYSTEM FOR CHANGING BUS DIRECTION IN DDR MEMORY SYSTEMS," concurrently filed with this application, and "HARDWARE COMMAND TRAINING FOR MEMORY USING READ COMMANDS," concurrently filed with this application, which are all herein incorporated by reference in their entirety.

BACKGROUND OF THE INVENTION

In memory qualification and validation, proper timing between a memory controller and DRAM chips must be ensured. The memory controller must ensure that the command signals meet setup and hold time tolerances at the DRAM chip. Current methods to train command signals is achieved by the cumbersome method of extracting trace length and delays of chip select and clock signals for each and every board type using various printed circuit board trace length extraction tools. With the help of a software algorithm, the delays are analyzed and compensated for.

The current methodology is error prone as it involves interaction of various tools, software and manual interpretation of results. Further, it is time consuming as all the tools need to be set up and loaded with the proper constraints and the process must be repeated for every possible board type and every possible memory configuration. Finally, the methodology is not ideal because as the frequency of DRAM increases, the available command and clock eye width decreases making it increasingly difficult to obtain a common skew compensation across the entire silicon process range.

BRIEF SUMMARY OF THE INVENTION

Accordingly, a need exists for a method and system of automatic hardware based memory controller command training. Embodiments of the present invention disclose a method and system for automatically training the skew between command and clock signals using the write leveling mechanism for memory devices, e.g. DDR3 compatible devices.

More specifically, embodiments of the present invention are directed towards a method of training a command signal for a memory module. The method includes programming a memory controller into a mode wherein a single bit of an address signal is active for a single clock cycle. The method then programs a programmable delay line of the address signal with a delay value and performs initialization of the memory module. The memory module is then placed in a write leveling mode. A write leveling procedure is then performed and a response thereto is determined from the memory module. A determination is made whether the memory module is in a pass state or an error state based on the response.

In another embodiment, the present invention is drawn to a computer readable storage medium having stored thereon, computer executable instructions that, if executed by a computer system cause the computer system to perform a method of training chip select for a memory module. The method includes programming a memory controller into a mode wherein a single bit of an address signal is active for a single clock cycle. The method then programs a programmable delay line of the address signal with a delay value and performs initialization of the memory module. The memory module is then placed in a write leveling mode. A write leveling procedure is then performed and a response thereto is determined from the memory module. A determination is made whether the memory module is in a pass state or an error state based on the response.

In yet another embodiment, the present invention is drawn to a system. The system comprises a processor coupled to a computer readable storage media using a bus and executing computer readable code which causes the computer system to perform a method of training chip select for a memory module. The method includes programming a memory controller into a mode wherein a single bit of an address signal is active for a single clock cycle. The method then programs a programmable delay line of the address signal with a delay value and performs initialization of the memory module. The memory module is then placed in a write leveling mode. A write leveling procedure is then performed and a response thereto is determined from the memory module. A determination is made whether the memory module is in a pass state or an error state based on the response.

BRIEF DESCRIPTION OF THE DRAWINGS

The embodiments of the present invention are illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 1:
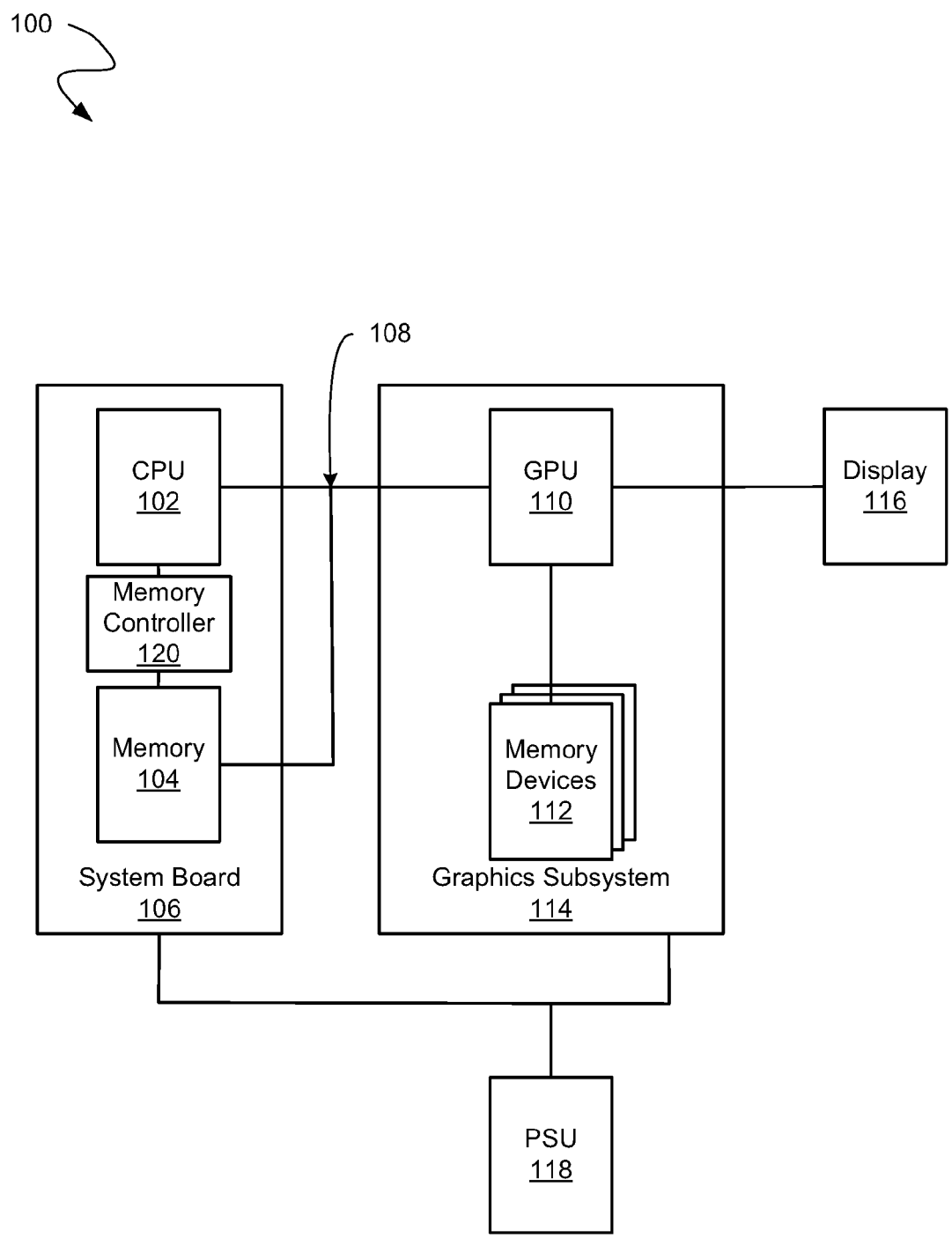
FIG. 1 shows an exemplary computer system, in accordance with one embodiment of the present invention.

FIG. 1 shows an exemplary computer system 100 in accordance with one embodiment of the present invention. Computer system 100 depicts the components in accordance with embodiments of the present invention providing the execution platform for certain hardware-based and software-based functionality, in particular, computer graphics rendering and display capability. In general, computer system 100 comprises a system board 106 including at least one central processing unit (CPU) 102 and a system memory 104. The CPU 102 can be coupled to the system memory 104 via a memory controller 120 or can be directly coupled to the system memory 104 via a memory controller internal (not shown) to the CPU 102. In an embodiment, system memory 104 may be DDR3 SDRAM.

Computer system 100 also comprises a graphics subsystem 114 including at least one graphics processor unit (GPU) 110. For example, the graphics subsystem 114 may be included on a graphics card. The graphics subsystem 114 may be coupled to a display 116. One or more additional GPU(s) 110 can optionally be coupled to computer system 100 to further increase its computational power. The GPU(s) 110 may be coupled to the CPU 102 and the system memory 104 via a communication bus 108. The GPU 110 can be implemented as a discrete component, a discrete graphics card designed to couple to the computer system 100 via a connector (e.g., AGP slot, PCI-Express slot, etc.), a discrete integrated circuit die (e.g., mounted directly on a motherboard), or as an integrated GPU included within the integrated circuit die of a computer system chipset component (not shown). Additionally, memory devices 112 may be coupled with the GPU 110 for high bandwidth graphics data storage, e.g., the frame buffer. In an embodiment, the memory devices 112 may be dynamic random-access memory. A power source unit (PSU) 118 may provide electrical power to the system board 106 and graphics subsystem 114.

The CPU 102 and the GPU 110 can also be integrated into a single integrated circuit die and the CPU and GPU may share various resources, such as instruction logic, buffers, functional units and so on, or separate resources may be provided for graphics and general-purpose operations. The GPU may further be integrated into a core logic component. Accordingly, any or all the circuits and/or functionality described herein as being associated with the GPU 110 can also be implemented in, and performed by, a suitably equipped CPU 102. Additionally, while embodiments herein may make reference to a GPU, it should be noted that the described circuits and/or functionality can also be implemented with other types of processors (e.g., general purpose or other special-purpose coprocessors) or within a CPU.

System 100 can be implemented as, for example, a desktop computer system or server computer system having a powerful general-purpose CPU 102 coupled to a dedicated graphics rendering GPU 110. In such an embodiment, components can be included that add peripheral buses, specialized audio/video components, IO devices, and the like. Similarly, system 100 can be implemented as a portable device (e.g., cellphone, PDA, etc.), direct broadcast satellite (DBS)/terrestrial set-top box or a set-top video game console device such as, for example, the Xbox®, available from Microsoft Corporation of Redmond, Wash., or the PlayStation3®, available from Sony Computer Entertainment Corporation of Tokyo, Japan. System 100 can also be implemented as a "system on a chip", where the electronics (e.g., the components 102, 104, 110, 112, and the like) of a computing device are wholly contained within a single integrated circuit die. Examples include a hand-held instrument with a display, a car navigation system, a portable entertainment system, and the like.

Figure 2:
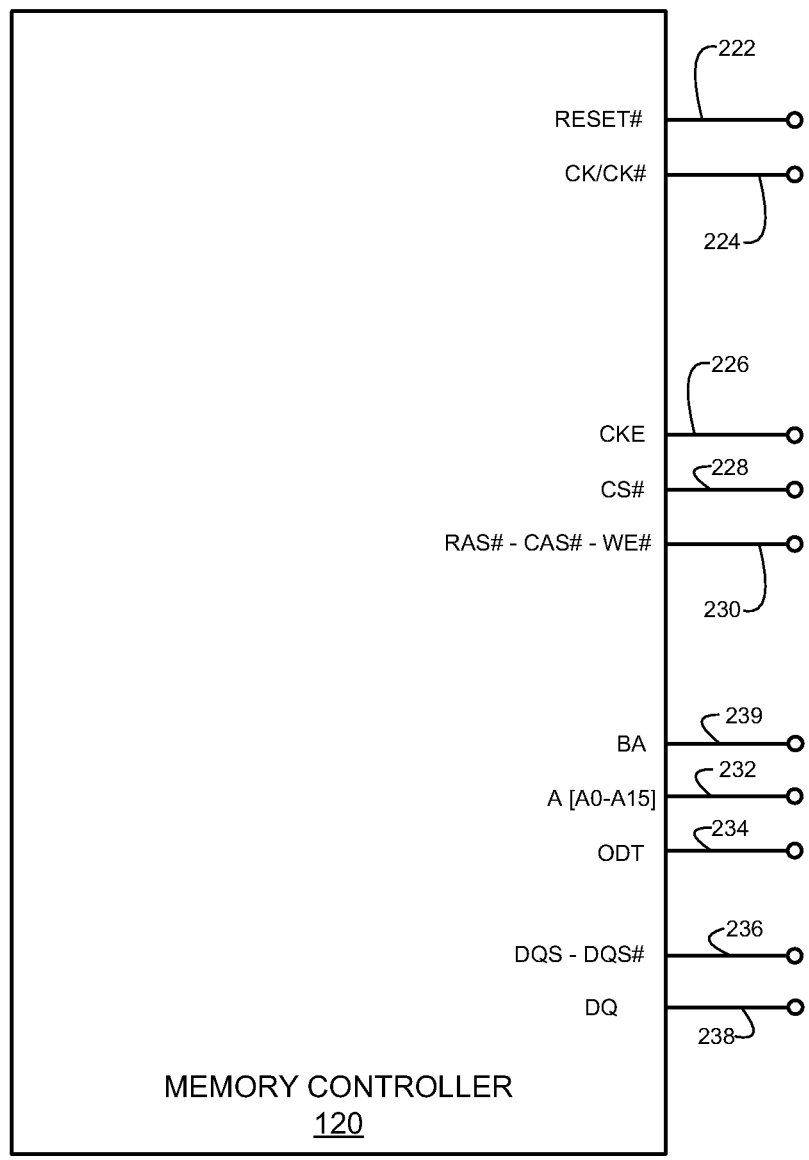
FIG. 2 shows an exemplary memory controller comprising a plurality of signal outputs, in accordance with one embodiment of the present invention.

FIG. 2 shows an exemplary memory controller 120 comprising a plurality of signal outputs, in accordance with one embodiment of the present invention. Memory controller 120 is a digital circuit operable to manage the flow of data going to and from memory module 104 (FIG. 1). Memory controller 120 includes logic necessary to read and write to memory module 104 (FIG. 1) and to refresh memory module 104 (FIG. 1) by sending current through the entire device.

Memory controller 120 includes output signals consistent with the JEDEC DDR3 SDRAM Specification. The output signals are sent to memory module 104 (FIG. 1). The output signals include RESET#222, CK/CK#224, CKE 226, CS#228, RAS#-CAS#-WE#230, A 232, BA 239 and ODT 234. RESET#222 is an active low asynchronous reset operable to reset memory module 104 (FIG. 1). CK/CK#224 is a different clock signal operable to clock memory module 104 (FIG. 1). CKE 226 is a clock enable signal operable for instructing memory module 104 (FIG. 1) to acknowledge clock transitions. CS#228 is a chip select signal operable for rank (not shown) selection on memory module 104 (FIG. 1). RAS#-CAS#-WE#230 are command outputs to memory module 104 (FIG. 1) that define the command being entered. A 232 is a 16-bit address output providing the row address for Active commands and column address for read/write commands to select one location out of the memory array in a respective bank (not shown) of memory module 104 (FIG. 1). Address outputs also provide the op-code during Mode Register Set (MRS) commands to memory module 104 (FIG. 1). BA 239 is a bank address output defining to which bank (not shown) of memory module 104 (FIG. 1) an active read, write or precharge command is being applied. Bank address also determines which mode register of memory module 104 (FIG. 1) is to be accessed during a MRS cycle. ODT 234 is on die termination output and enables termination resistance internal to the memory module 104 (FIG. 1).

Figure 3:
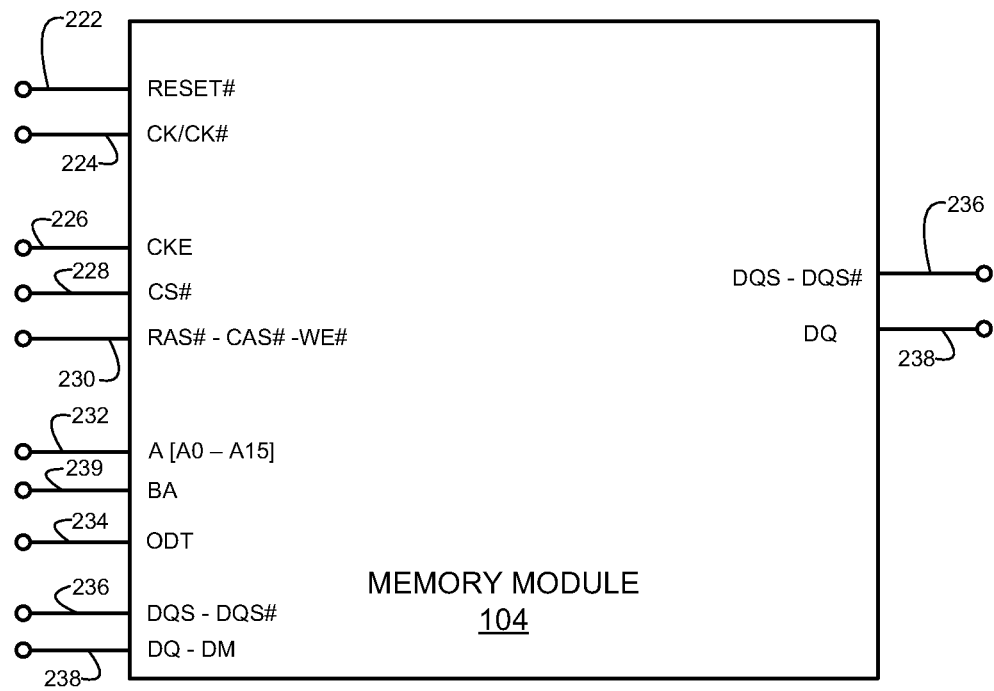
FIG. 3 shows an exemplary memory module comprising a plurality of signal inputs and a plurality of signal outputs, in accordance with one embodiment of the present invention.

Memory controller 120 also includes bidirectional signals DQS-DQS#236 and DQ 238 (both described in FIG. 3).

Embodiments of the present invention enable the hardware within computer system 100 (FIG. 1) to automatically train the skew between command (CMD) signals and clock 224 signals. CMD signals include A 232, BA 239 and RAS#-CAS#-WE#230. Training of the command signals is accomplished by training the skew of a single bit of address signal 232 and clock 224 signals using a write leveling mechanism for DDR3 devices. The JEDEC DDR3 SDRAM Specification supports a write leveling feature to allow the memory controller 120 to compensate for skew between the clock 224 and the data strobe 338 (FIG. 3). The memory controller can use the write leveling feature and feedback from the memory module 104 (FIG. 1) to adjust the DQS-DQS#236 (described in FIG. 3) to CK-CK#224 relationship. However, the JEDEC DDR3 SDRAM Specification does not provide for any method to train the command signals (A 232, BA 239 and RAS#-CAS#-WE#230) vs. clock 224 delay.

The present invention makes use of the write leveling feature to train the command signals vs. clock 224 delay.

Embodiments of the present invention provide for a method to train command signals on memory controller 120. Often times, there may be a high variance in the skew between the command signals and the clock signal 224. This variance may be attributed to silicon speed grade, packaging, board trace length, or variable DIMM fly by delay due to loading. Since the memory module 104 (FIG. 1) is synchronous, the memory controller 120 must assure that the command signals meet setup and hold time requirements at the memory module 104 (FIG. 1). In an embodiment, the command signals may be associated with a programmable delay line operable to delay the address signal 232.

Command signal training is typically a part of memory qualification and validation procedures. One advantage to using the write leveling feature to train the command signal vs. clock 224 delay is that the memory module 104 (FIG. 1) need not be fully functional prior to training. For example, read and write commands to the memory module 104 (FIG. 1) need not be functional at the time of training.

Memory controller 120 supports three features consistent with the training. First, memory controller 120 supports adjustable delay settings on command signals (A 232, BA 239 and RAS#-CAS#-WE#230), clock 224, and control signals (not shown).

Second, memory controller 120 also supports a special mode wherein all command signals are driven for a programmable time period rather than a single clock cycle. This mode is used for performing memory module 104 (FIG. 1) initialization before a write leveling procedure is performed.

Third, memory controller 120 supports a special mode wherein all command signal except for bit A7 (of address bus A 232) are driven for a programmable time period and bit A7 is driven for exactly one single clock cycle. This mode is used for sending a write leveling mode register set command during command training. Since bit A7 is driven for a single clock cycle only, this mode ensures that all remaining address bus A 232 bits are sampled correctly at the memory module 104 (FIG. 1) as they are practically held static by driving the bits static for a significant time period. While sending a mode register set command, if bit A7 is sampled as a binary one, memory module 104 (FIG. 1) will enter a write leveling mode. If bit A7 is sampled as a binary zero, memory module 104 (FIG. 1) will not enter the write leveling mode.

Furthermore, memory controller 120 also supports a mechanism to reset the memory module 104 (FIG. 1) via the RESET# signal 222. During command signal training, it is possible to place the memory module 104 in a bad state if the setup and hold of the command signals is violated. In an embodiment, the chip memory module 104 (FIG. 1) is reset via the RESET# signal 222 after every command signal training iteration.

FIG. 3 shows an exemplary memory module 104 comprising a plurality of signal inputs and a plurality of signal outputs, in accordance with one embodiment of the present invention. In an embodiment, memory module 104 is a double data rate type three synchronous dynamic random access memory (DDR3 SDRAM). Memory module 104 receives the same signals output from memory controller 120 (FIG. 2) as input signals. These signals include RESET#222, CK/CK#224, CKE 226, CS#228, RAS#-CAS#-WE #230, A [A0-A15] 232, BA 239 and ODT 234, described above in FIG. 2. In addition, memory module 104 includes bidirectional signals DQS DQS#236 and DQ-DM#238.

DQS-DQS#236 is the data strobe signal that is output with read data and input with write data. The data strobe is edge-aligned with read data and centered with write data. DQ 238 is the bi-directional data bus wherein data is transmitted over the bus.

Figure 4:
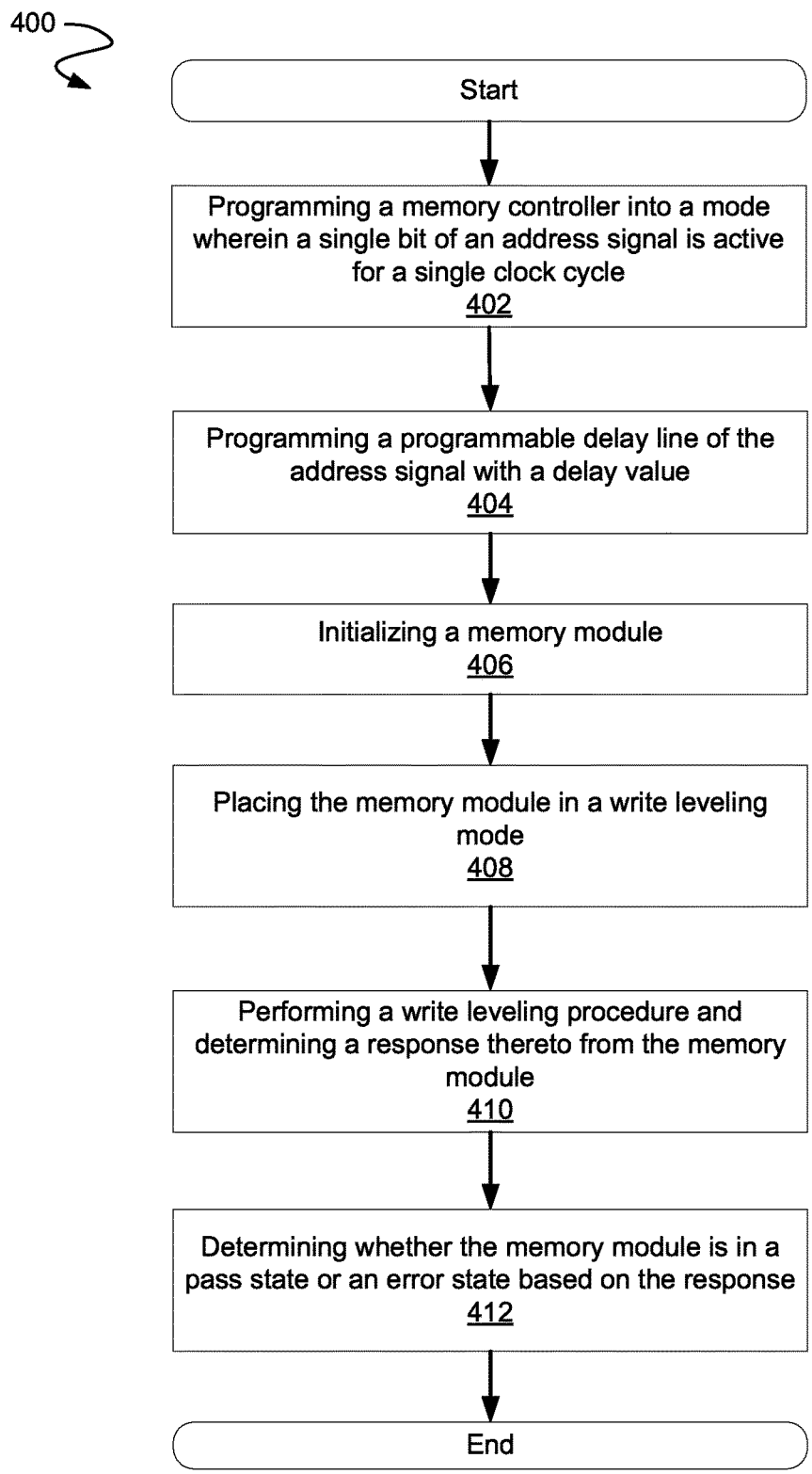
FIG. 4 depicts a flowchart of an exemplary computer process of training chip select for a memory module, in accordance with one embodiment of the present invention.

FIG. 4 depicts a flowchart of an exemplary computer process of training command signals for a memory module, in accordance with one embodiment of the present invention. The computer-controlled process of flowchart 400 may be implemented on the system of FIG. 1. In block 402, a memory controller is programmed into a mode wherein a single bit of an address signal is active for a single clock cycle. For example, in FIG. 2, the memory controller is programmed into a mode, via the RAS#-CAS#-WE# signals, wherein a single bit of an address signal is active for a single clock cycle.

In block 404, a programmable delay line of the address signal is programmed with a delay value. For example, in FIG. 2, a programmable delay line associated with the address line of the memory controller is programmed with a delay value. In an embodiment, the delay line may be reprogrammed with a different delay value in subsequent iterations of the command signal training. In an embodiment, a plurality of address signals associated with the memory module are held static for a predetermined period of clock cycles.

In block 406, the memory module is initialized. For example, in FIG. 3, the memory module is initialized. Initialization of the memory module is performed via the memory controller. In an embodiment, the memory module may be compatible with DDR3 SDRAM.

In block 408, the memory module is placed in a write leveling mode. For example, in FIG. 3, the memory module is placed in a write leveling mode via a MRS command. The address signals from the memory controller provide the op-code for the MRS command.

In block 410, a write leveling procedure is performed and a response thereto from the memory module is determined. For example, in FIG. 3, a write leveling procedure is performed on the memory module and the memory module's response to the write leveling procedure is determined. The write leveling procedure is specified in the JEDEC DDR3 Specification. During the write leveling procedure and other steps in the command signal training, the frequency of the memory controller and the frequency of the address line remain constant. If bit A7 of the address line is sampled as a binary one, memory module 104 (FIG. 1) will enter a write leveling mode. If bit A7 of the address line is sampled as a binary zero, memory module 104 (FIG. 1) will not enter the write leveling mode.

In block 412, it is determined whether the memory module is in a pass state or an error state based on the response to the write leveling procedure. The memory module is in a pass state when a feedback from the memory module changes from a binary zero to a binary one. The memory module is in an error state when a feedback from the memory module remains a binary zero.

In an embodiment, the pass/error state of the memory module is recorded. If the memory module is determined to be in an error state, the memory module is reset via the #RESET signal. The programmable delay line is then reprogrammed with a different delay value and the chip select training process is repeated. Each subsequent pass/error state of the memory module is recorded and a range of values for where the memory module is in a pass state is compiled. These range of values represent the acceptable chips select timing values with respect to the clock to ensure proper function of the memory module.

Figure 5:
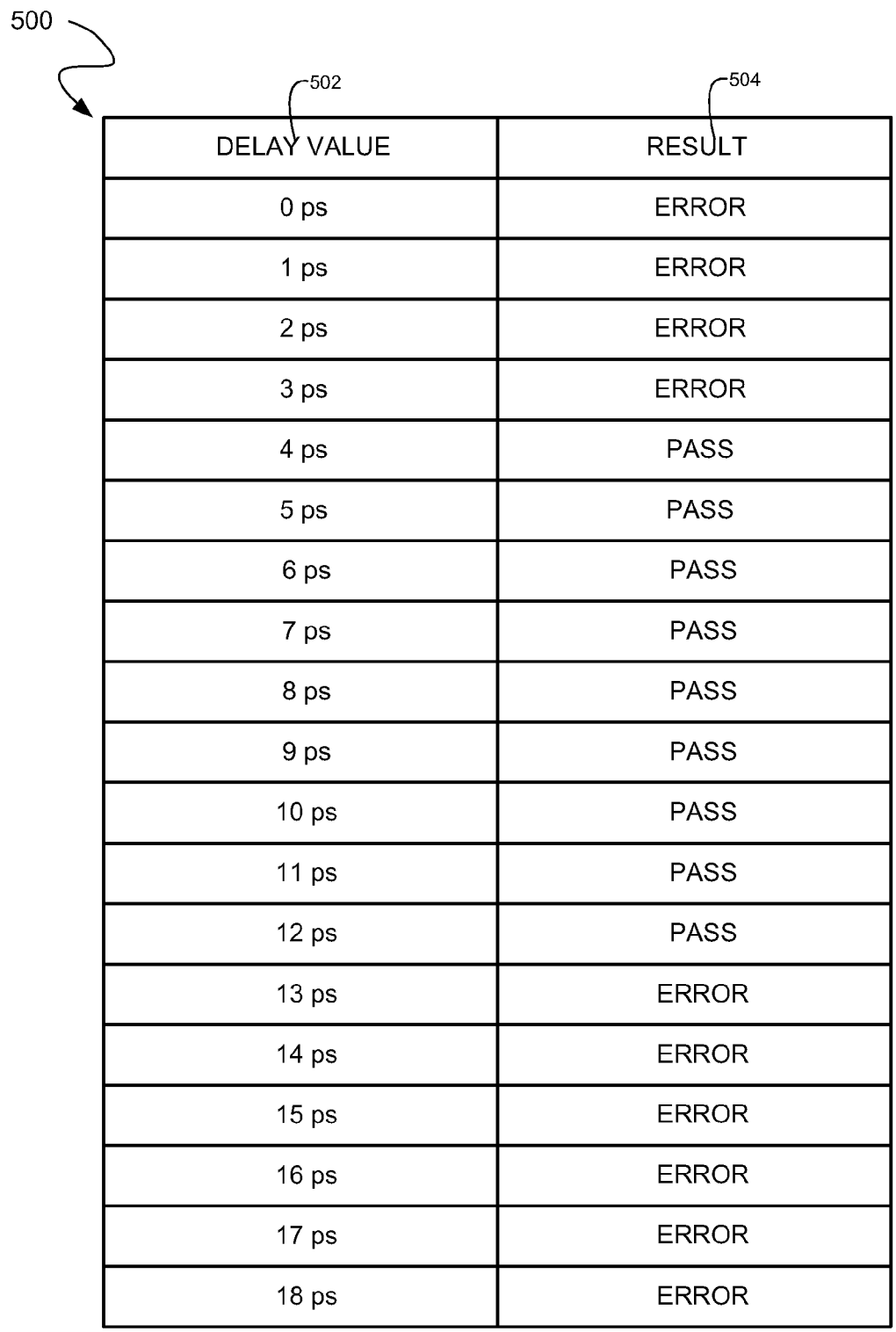
FIG. 5 depicts a plurality of delay values and corresponding results stored within memory in a tabular format, in accordance with one embodiment of the present invention.

FIG. 5 depicts a plurality of delay values and corresponding results stored within memory in a tabular format, in accordance with one embodiment of the present invention. In an embodiment, table 500 may be stored within memory 104 (FIG. 1). Table 500 stores each tested command signal delay value 502 (via delaying the address line) and its corresponding pass/error state result 504 for every iteration of the command signal training. Each subsequent pass/error state 504 of the memory module is recorded and a range of delay values 502 for where the memory module is in a pass state is compiled. These range of values represent the acceptable command signal timing values with respect to the clock to ensure proper function of the memory module.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

What is claimed is:

1. A method of training a command signal for a memory module, said method comprising:
   programming a memory controller into a mode wherein a first bit of an address signal is active for a single clock cycle;
   programming a first programmable delay line of said address signal with a delay value, such that said address signal is delayed by said delay value;
   initializing said memory module;
   during said initialization, sending said first bit of said address signal delayed by said delay value as a write leveling mode register set command, wherein said first bit is set at a first level;
   placing said memory module in a write leveling mode when said first bit is sampled at said first level at said memory module;
   at said memory controller, performing a write leveling procedure and determining a response thereto from said memory module;
   determining said memory module is in a pass state when said response comprises said first level and indicates said memory module is in said write leveling mode;
   determining said memory module is in an error state when said response comprises a second level opposite said first level and indicates said memory module is not in said write leveling mode; and
   programming a second programmable delay line of said command signal with said delay value when said memory module is in a pass state.

2. The method of claim 1 further comprising:
   resetting said memory module upon a determination of said error state;
   reprogramming said programmable delay line with another delay value; and
   repeating said placing said memory module in said write leveling mode, said performing said write leveling procedure, and said determining said memory module is in said pass state or in said error state.

3. The method of claim 2 further comprising determining a range of delay values that result in said memory module determined to be in said pass state.

4. The method of claim 1 further comprising maintaining a frequency of said memory controller constant and maintaining a frequency of said address signal constant.

5. The method of claim 1 wherein a plurality of bits of said address signal except for said first bit are active for a programmable time period.

6. The method of claim 1 wherein said determining said memory module is in a pass state or an error state comprises:
   determining that said memory module is in said pass state when a feedback from said memory module changes from a binary zero to a binary one; and
   determining that said memory module is in said error state when said feedback remains a binary zero.

7. The method of claim 1, wherein said command signal is taken from a group consisting of said address (A) signal, a bank address (BA) signal, a row address strobe (RAS#), a column access strobe (CAS#), a chip select (CS#), and a write enable (WE).

8. A non-transitory computer readable storage medium having stored thereon, computer executable instructions that, if executed by a computer system cause the computer system to perform a method of training a command signal for a memory module, said method comprising:
   programming a memory controller into a mode wherein a first bit of said address signal is active for a single clock cycle;
   programming a first programmable delay line of said address signal with a delay value, such that said address signal is delayed by said delay value;
   initializing said memory module;
   during said initialization, sending said first bit of said address signal delayed by said delay value as a write leveling mode register set command, wherein said first bit is set at a first level;
   placing said memory module in a write leveling mode when said first bit is sampled at said first level at said memory module;
   at said memory controller, performing a write leveling procedure and determining a response thereto from said memory module; and
   determining said memory module is in a pass state when said response comprises said first level and indicates said memory module is in said write leveling mode;
   determining said memory module is in an error state when said response comprises a second level opposite said first level and indicates said memory module is not in said write leveling mode; and
   programming a second programmable delay line of said command signal with said delay value when said memory module is in a pass state.

9. The computer readable storage medium of claim 8, wherein said method further comprises:
   resetting said memory module upon a determination of said error state;
   reprogramming said programmable delay line with another delay value; and
   repeating said placing said memory module in said write leveling mode, said performing said write leveling procedure, and said determining said memory module is in said pass state or in said error state.

10. The computer readable storage medium of claim 9 wherein said method further comprises determining a range of delay values that result in said memory module determined to be in said pass state.

11. The computer readable storage medium of claim 8 wherein said method further comprises maintaining a frequency of said memory controller constant and maintaining a frequency of said address signal constant.

12. The computer readable storage medium of claim 8 wherein a plurality of bits except for said first bit of said address signal are active for a programmable time period.

13. The computer readable storage medium of claim 8 wherein said determining said memory module is in a pass state or an error state comprises:
   determining that said memory module is in said pass state when a feedback from said memory module changes from a binary zero to a binary one; and
   determining that said memory module is in said error state when said feedback remains a binary zero.

14. The computer readable storage medium of claim 8, wherein said command signal is taken from a group consisting of said address (A) signal, a bank address (BA) signal, a row address strobe (RAS#), a column access strobe (CAS#), a chip select (CS#), and a write enable (WE).

15. A system comprising:
   a processor coupled to a non-transitory computer readable storage media using a bus and executing computer readable code which causes the computer system to perform a method of training a command signal for a memory module, said method comprising:
   programming a memory controller into a mode wherein a first bit of said address signal is active for a single clock cycle;
   programming a first programmable delay line of said address signal with a delay value, such that said address signal is delayed by said delay value;
   initializing said memory module;
   during said initialization, sending said first bit of said address signal delayed by said delay value as a write leveling mode register set command, wherein said first bit is set at a first level;
   placing said memory module in a write leveling mode when said first bit is sampled at said first level at said memory module;
   at said memory controller, performing a write leveling procedure and determining a response thereto from said memory module; and
   determining said memory module is in a pass state when said response comprises said first level and indicates said memory module is in said write leveling mode;
   determining said memory module is in an error state when said response comprises a second level opposite said first level and indicates said memory module is not in said write leveling mode; and
   programming a second programmable delay line of said command signal with said delay value when said memory module is in a pass state.

16. The system of claim 15, wherein said method further comprises:
   resetting said memory module upon a determination of said error state;
   reprogramming said programmable delay line with another delay value; and
   repeating said placing said memory module in said write leveling mode, said performing said write leveling procedure, and said determining said memory module is in said pass state or in said error state.

17. The system of claim 16 wherein said method further comprises determining a range of delay values that result in said memory module determined to be in said pass state.

18. The system of claim 15 wherein said method further comprises maintaining a frequency of said memory controller constant and maintaining a frequency of said address signal constant.

19. The system of claim 15 wherein said determining said memory module is in a pass state or an error state comprises:
   determining that said memory module is in said pass state when a feedback from said memory module changes from a binary zero to a binary one; and
   determining that said memory module is in said error state when said feedback remains a binary zero.

20. The system of claim 15, wherein said command signal is taken from a group consisting of said address (A) signal, a bank address (BA) signal, a row address strobe (RAS#), a column access strobe (CAS#), a chip select (CS#), and a write enable (WE).

* * * * *